Figure 1:
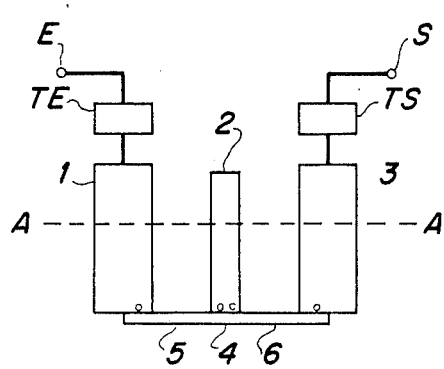

United States Patent

Ernyei

[11] 4,060,774
[45] Nov. 29, 1977

[54] ELECTROMECHANICAL BAND-PASS FILTER FOR HIGH FREQUENCIES

[75] Inventor: Herbert Ernyei, Paris, France

[73] Assignee: Societe Lignes Telegraphiques et Telephoniques, Paris, France

[21] Appl. No.: 695,920

[22] Filed: June 14, 1976

[51] Int. Cl.² .......................... H03H 9/04; H03H 9/26
[52] U.S. Cl. .......................................... 333/71; 333/72
[58] Field of Search ....................... 333/71, 72; 310/26

[56] References Cited

U.S. PATENT DOCUMENTS 3,013,228   12/1961   Kettel et al. ............................ 333/71

FOREIGN PATENT DOCUMENTS 1,416,791   10/1968   Germany ................................ 333/71

Primary Examiner—Alfred E. Smith
Assistant Examiner—Marvin Nussbaum
Attorney, Agent, or Firm—Kemon & Estabrook

[57] ABSTRACT

In an electromechanical filter made of longitudinally vibrating cylindrical metal bars connected through bending vibrating coupling rods, the coupling rods are connected to one of the end faces of said resonators. A plurality of resonators are connected to a unitary rod.

4 Claims, 4 Drawing Figures

ELECTROMECHANICAL BAND-PASS FILTER FOR HIGH FREQUENCIES

BACKGROUND OF THE INVENTION

The present invention concerns mechanical high-frequency band-pass filters comprising a number of resonators formed of metallic bars (for example of stainless steel), which vibrate longitudinally in compression and extension and which are coupled together by coupling rods constituting mechanical acoustic transmission line elements and working in flexure. Such filters are used in carrier-current telephone transmission circuits, the central frequency of the transmitted band being, for example, 128 kHz and the bandwidth being 4 kHz.

The resonator bars are, in known manner, of cylindrical form with their axes parallel and situated in a common plane. They are coupled together by rectilinear rods situated substantially in this same plane and connected to at least one of the plane terminal faces of the resonators, situated in a plane perpendicular to the said axes. The inter-resonator lengths of these coupling rods (hereinafter briefly referred to as "couplers"), which work in bending, are in an appropriately calculated ratio to the propagation wavelength in the said rods for the central frequency of the operating frequency band.

PRIOR ART

Filters of the aforesaid kind are well known, for example from French Pat. No. 1,191,701 applied for on the 19, 1958, by TELEFUNKEN, which are composed of identical resonators tuned (for their fundamental frequency) to the central frequency of the operating bandwidth and having their neighbouring resonators connected by couplers in the form of rods fixed to either end of the said resonators, to the axes of which, in the state of rest, these couplers are substantially perpendicular. Such an arrangement requires that the resonators all be of exactly the same length, because the couplers must form, in the state of rest, two straight lines perpendicular to the axes of the resonators.

Such filters have the following disadvantages:

a. the resonators must have strictly identical axial lengths, so that it is not possible to adjust the lengths so as to take account of the lack of homogeneity (elasticity and density variations) of the metal;

b. the resonators cannot have different lengths, because the couplers connected to their two ends must be parallel, so that it is not possible to provide filters other than those having resonators which are all identical (or at least of like length). Now, it is well known that such filters, which are sometimes called "parametric filters" do not, as a function of a frequency, behave as filters having a well-defined bandwidth unless they are connected at their ends to so-called "iterative" impedances, which it is not physically possible to provide at the point at which they are connected at the input as at the output. Now, in practice, it is desirable to provide filters which can be connected to ohmic resistances and which then have in the bandwidth a predetermined behaviour, for example that known as the Tschebyscheff or the Butterworth behaviour, which requires resonators which are not all identical and corresponding couplers.

In accordance with the present invention, the aforesaid disadvantages are obviated by means of the following arrangements:

1. the neighbouring resonators are coupled together only at one of their two ends, so that it is possible to design them with different axial lengths and consequently different resonance frequencies, 2. the different resonators may have different cross-sections obtained, for example, from a common circular cross-section on which flats are formed, in a direction parallel to the longitudinal axis of the cylinder which appropriately decrease the cross-section of each of them, 3. the couplers working in bending have identical cross-sections and lengths, for example a quarter-wave, or a common fraction of the wavelength which is less than a quarter-wave, and 4. the consecutive couplers are made from a common cylindrical rod, spot-welded to the resonators.

In a first embodiment of the invention, all the couplers between resonators are situated in prolongation of one another.

In a second embodiment of the invention, the couplers are distributed in two or more groups, in each of which they are in prolongation of one another, each of these groups being connected to the co-planar ends of a group of neighbouring resonators and at least one of the groups of couplers being connected at the opposite ends to the preceding ones of another group of neighbouring resonators.

Figure 2:
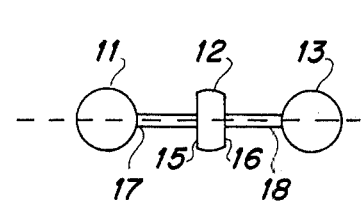
Figure 3:
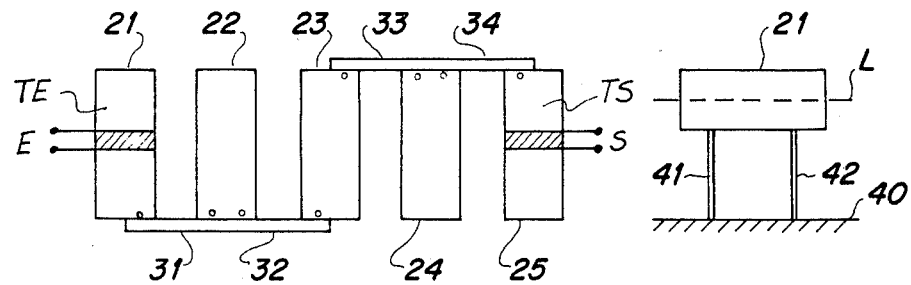
Figure 4:
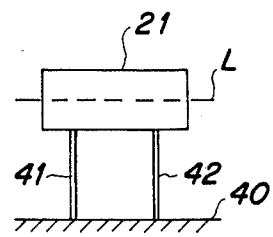

The invention and its advantages will be more readily understood from the following description of various embodiments, which is given with reference to the accompanying drawings, in which:

FIG. 1 shows, in projection on a plane parallel to the longitudinal axes of the resonators, the assembly of a number of neighbouring resonators and of their couplers, FIG. 2 shows the cross-section of the device of FIG. 1, in a plane perpendicular to the said axes, as well as the projection of the couplers on to this same plane, FIG. 3 shows a variant of the construction of the device of FIG. 1, and FIG. 4 shows a preferred method of individually fixing the resonators of one of the preceding embodiments.

Referring first of all to FIG. 1, there will be seen therein a filter formed of three resonators 1, 2, 3 of which the resonators 1 and 3 are assumed to have identical cross-sections, and the resonator 2 to have a smaller cross-section. Resonator 1 is coupled to the electric input terminal E by the diagrammatically indicated electromechanical transducer TE, while resonator 3 is coupled to the electric output terminal S by the diagrammatically indicated mechanicoelectrical transducer TS. The axial lengths (vertical in relation to FIG. 2) of resonators 1, 2, 3 may be different, because only their lower ends connected together by the coupling rod 4 are coplanar, the two consecutive fractions 5 and 6 of the said rod being connected to the resonators 1, 2, 3 by spot welding.

There is shown in FIG. 2 the cross-section of the device of FIG. 1 along the plane A-A perpendicular to the axes of the resonators. The sections 11 and 13 of resonators 1 and 3 are identical and circular, while the section 12 of resonator 2 is smaller, the reduction of the said section being obtained by means of flats 15, 16 machined on the sides of a cylindrical bar originally similar to 1 and 3. Of course, this arrangement has no limiting character, and the sections 11, 12, 13 may have any other forms.

There will again be seen in FIG. 2, at 17, 18, the projections on the plane of this same figure of the couplers 5 and 6 of FIG. 1, which are preferably assumed to be disposed substantially along a plane of symmetry of the lower terminal sections of the resonators 1, 2, 3. In FIG. 1, the couplers 5 and 6 have, between the welding spots by which they are connected to the resonators 1 and 2, on the one hand, and 2 and 3 on the other hand, identical lengths which are equal to a quarter-wave for the central frequency of the bandwidth of the filter and for the speed of propagation in the rod constituting the said couplers.

This dimensioning has no limiting character and the lengths of the couplers may be equal to a common fraction of such a quarter-wavelength for filters whose other elements are accordingly designed, as already mentioned.

Referring now to FIG. 3, there will be seen therein a modified construction comprising five resonators 21 to 25, of which the first three 21 to 23 are coupled together by couplers 31 and 32 connected to the neighbouring ends of 21, 22, 23, while the resonators 23, 24, 25 are coupled together by couplers 33, 34 connected to the opposite ends (adjacent one another) of the remaining resonators. The resonators 21 and 25 here represent the transducers TE and TS of FIG. 1. The arrangement of FIG. 3 may have advantages from the viewpoint of overall dimensions or the mode of attachment of the filter assembly. Another advantage is the possible difference in the diameters of the coupling rods between the groups 21-23 and 23-25.

Finally, referring to FIG. 4, there will be seen therein a particularly advantageous mode of securing the resonators such as 21 to a common base plate 40. The resonator 21 is welded to one of the ends of each of two rods 41 and 42 which are perpendicular to its longitudinal axis L. In addition, these rods have their other ends welded (or fastened in any other manner) to base plate 40 so that the lengths of 41 and 42 are substantially equal to a quarter-wave of the first bending vibration mode at the central frequency of the bandwidth of the filter and for the longitudinal propagation speed in the said rods; everything happens as if the resonator 21 were fixed in space from the static viewpoint, but entirely free from the vibrational viewpoint.

The construction of a filter according to the invention pre-supposes that it is possible to calculate, for each of the resonators and the couplers, the mechanical characteristics of these elements, as a function of the central frequency and of the operating bandwidth, as well as of the form desired for the "attenuation-frequency" curve of the filter within the bandwidth and in the neighbourhood of the upper and lower limits of the latter.

Proceeding from the known diagrams equivalent electric filters, it is possible to calculate the parameters of the corresponding mechanical filters by means of the rules given, for example, in the article by R. A. JOHNSON and A. E. GUENTHER, published in the American Journal "I.E.E.E. Transactions on Sonics and Ultrasonics", Vol. S.U.-21, No. 4, Oct. 1974, pages 244 to 256. From the values of these parameters, it is possible to deduce the appropriate frequencies of the resonators and their mass per unit axial length, and therefore their mechanical dimensioning, for a construction from a given metal of known density and known modulus of elasticity, as for example the alloy known under the trade name "Elinvar". The parameters of the mechanical couplers — length and diameter of the coupling rods — will likewise be deduced from the values of the elements of the equivalent electric circuits.

What we claim:

1. An electromechanical band pass filter comprising: substantially cylindrical mechanical resonators operating in a longituinal mode arranged with their axes parallel and in the same plane; wires operating in a bending mode coupling said resonators so that two adjacent resonators are coupled through a single quarter wave length wire connected at one of their terminal faces located in a same plane, and said resonators are divided into two sets, all the resonators of one set having one first terminal face in a first plane and all the resonators of the other set having a second terminal face in a second plane, one resonator belonging to both sets and the couplers for each set being a single wire.

2. Electromechanical band-pass filter according to claim 1, in which at least part of the resonators is fixed to a base plate by means of rods the length of which approximates the quarter wavelength for the bending vibration, at the central frequency of the band.

3. An electromechanical band pass filter comprising: substantially cylindrical mechanical resonators operating in a longitudinal mode arranged with their axes parallel and in the same plane; wires operating in a bending mode coupling said resonators so that two adjacent resonators are coupled through a single quarter wave length wire connected at one of their terminal faces located in the same plane, and the second of their terminal faces are located in different planes parallel to said first plane.

4. An electromechanical band pass filter comprising: substantially cylindrical mechanical resonators operating in a longitudinal mode arranged with their axes parallel and in the same plane; wires operating in a bending mode coupling said resonators so that two adjacent resonators are coupled through a single quarter wave length wire connected at one of their terminal faces located in the same plane and said resonators have different cross sections to meet the resonant frequency requirements of parametric filters.

* * * * *

UNITED STATES PATENT OFFICE
CERTIFICATE OF CORRECTION

PATENT NO. : 4,060,774
DATED : November 29, 1977
INVENTOR(S) : HERBERT ERNYEI

It is certified that error appears in the above-identified patent and that said Letters Patent are hereby corrected as shown below:

On the title page, the following should be added:

-- [30]   Foreign Application Priority Data

July 31, 1975   French......75 24 037 --.

Column 1, line 31, ahead of "19" insert

-- February --.

*Signed and Sealed this*

*Twenty-third* Day of *October 1979*

[SEAL]

Attest:

RUTH C. MASON
*Attesting Officer*

LUTRELLE F. PARKER
*Acting Commissioner of Patents and Trademarks*